United States Patent
Alsop et al.

(10) Patent No.: US 11,163,028 B2
(45) Date of Patent: Nov. 2, 2021

(54) SYSTEM AND METHOD FOR IMPROVED SPIN-ECHO-BASED MAGNETIC RESONANCE IMAGING

(71) Applicant: Beth Israel Deaconess Medical Center, Inc., Boston, MA (US)

(72) Inventors: David C. Alsop, Newton, MA (US); Li Zhao, Boston, MA (US)

(73) Assignee: BETH ISRAEL DEACONESS MEDICAL CENTER, INC., Boston, MA (US)

( * ) Notice: Subject to any disclaimer, the term of this patent is extended or adjusted under 35 U.S.C. 154(b) by 101 days.

(21) Appl. No.: 16/498,672

(22) PCT Filed: Mar. 22, 2018

(86) PCT No.: PCT/US2018/023762
§ 371 (c)(1),
(2) Date: Sep. 27, 2019

(87) PCT Pub. No.: WO2018/187040
PCT Pub. Date: Oct. 11, 2018

(65) Prior Publication Data
US 2020/0041598 A1    Feb. 6, 2020

Related U.S. Application Data

(60) Provisional application No. 62/481,786, filed on Apr. 5, 2017.

(51) Int. Cl.
*G01R 33/561*    (2006.01)
*G06F 30/20*    (2020.01)
(Continued)

(52) U.S. Cl.
CPC ..... *G01R 33/5617* (2013.01); *G01R 33/5602* (2013.01); *G06F 30/20* (2020.01); *G06F 7/22* (2013.01)

(58) Field of Classification Search
CPC ............ G01R 33/5617; G01R 33/5602; G01R 33/565; G01R 33/288; G01R 33/56366; G06F 30/20; G06F 7/22
See application file for complete search history.

(56) References Cited

U.S. PATENT DOCUMENTS 6,160,397 A    12/2000    Washburn et al.
6,320,380 B1    11/2001    Wu et al.
(Continued)

FOREIGN PATENT DOCUMENTS

WO    2015/153614 A1    10/2015

OTHER PUBLICATIONS

International Search Report and Written Opinion for International Patent Application No. PCT/US2018/023762 dated Jun. 14, 2018.
(Continued)

*Primary Examiner* — Susan S Lee
(74) *Attorney, Agent, or Firm* — Quarles & Brady LLP

(57) ABSTRACT

Systems and methods for acquiring magnetic resonance imaging (MRI) images of a subject are provided. The method includes performing a pulse sequence to elicit spin echoes, wherein the pulse sequence includes a radio frequency (RF) excitation pulse and a series of RF refocusing pulses that refocus echoes with flip angles in the series of RF refocusing pulses that are varied. The method also includes scaling MRI data associated with each echo by a correction factor that is determined for each echo to create scaled MRI data and that is not the same for all echoes. The method then includes reconstructing an image of the subject using the scaled MRI data.

22 Claims, 8 Drawing Sheets

(51) Int. Cl.
*G01R 33/56* (2006.01)
*G06F 7/22* (2006.01)

(56) References Cited

U.S. PATENT DOCUMENTS 8,395,385 B2 * 3/2013 Lee .................... G01R 33/4835
324/307
2014/0009157 A1 1/2014 Umeda

OTHER PUBLICATIONS

Busse, R.F., "Reduced RF Power Without Blurring: Correcting for Modulation of Refocusing Flip Angle in FSE Sequences." Magnetic Resonance in Medicine 51:1031-1037 (2004), abstract; p. 1031, 1033, 1035; Fig 5b [online] [retrieved on May 22, 2018] URL= <https://onlinelibrary.wiley.com/doi/epdf/10.1002/mrm.20056>.
Busse, R. F., et al. "Fast spin echo sequences with very long echo trains: design of variable refocusing flip angle schedules and generation of clinical T2 contrast." Magnetic Resonance in Medicine: An Official Journal of the International Society for Magnetic Resonance in Medicine 55.5 (2006): 1030-1037.
European Patent Office. Extended European Search Report for application 18780847.2, dated Nov. 19, 2020.
Zhao, L. et al. "Optimization of flip angle design for reduced T2 blurring of 3D arterial spin labeling." Proc Intl Soc Mag Reson Med. vol. 3632. 2017.

* cited by examiner

SYSTEM AND METHOD FOR IMPROVED SPIN-ECHO-BASED MAGNETIC RESONANCE IMAGING

CROSS-REFERENCE TO RELATED APPLICATIONS

This application represents the national stage entry of PCT International Application No. PCT/US2018/023762 filed on Mar. 22, 2018, which is based on, claims priority to, and incorporates herein by reference in its entirely for all purposes, U.S. Provisional Application Ser. No. 62/481,786, filed Apr. 5, 2017, and entitled "System and Method for Improved Spin-Echo-Based Magnetic Resonance Imaging.

STATEMENT REGARDING FEDERALLY-SPONSORED RESEARCH

This invention was made with government support under Grant No. MH080729 awarded by the National Institutes of Health. The government has certain rights in the invention.

BACKGROUND

The present disclosure relates to systems and methods for producing medical images. More particularly, the present disclosure relates to systems and methods for producing improved images using magnetic resonance imaging (MRI) systems when employing spin-echo-based imaging techniques.

When a substance such as human tissue is subjected to a uniform magnetic field (polarizing field $B_0$), the individual magnetic moments of the nuclear spins in the tissue attempt to align with this polarizing field, but precess about it in random order at their characteristic Larmor frequency. Usually the nuclear spins are comprised of hydrogen atoms, but other NMR active nuclei are occasionally used. A net magnetic moment Mz is produced in the direction of the polarizing field, but the randomly oriented magnetic components in the perpendicular, or transverse, plane (x-y plane) cancel one another. If, however, the substance, or tissue, is subjected to a magnetic field (excitation field $B_1$; also referred to as the radiofrequency (RF) field) which is in the x-y plane and which is near the Larmor frequency, the net aligned moment, Mz, may be rotated, or "tipped" into the x-y plane to produce a net transverse magnetic moment Mt, which is rotating, or spinning, in the x-y plane at the Larmor frequency. The practical value of this phenomenon resides in the signal which is emitted by the excited spins after the excitation field $B_1$ is terminated. There are a wide variety of measurement sequences in which this nuclear magnetic resonance (NMR) phenomenon is exploited.

When utilizing these signals to produce images, magnetic field gradients (Gx, Gy, and Gz) are employed. Typically, the region to be imaged experiences a sequence of measurement cycles in which these gradients vary according to the particular localization method being used. The emitted MR signals are detected using a receiver coil. The MRI signals are then digitized and processed to reconstruct the image using one of many well-known reconstruction techniques.

"Spin echoes" are produced in MRI when employing multiple RF pulses, typically at least an excitation RF pulse and a single refocusing RF pulse. In a spin echo (SE) pulse sequences, the flip angles for these pulses are often 90° and 180°, respectively. A spin echo, formed by the refocusing RF pulse, is typically encoded as a single k-space line beginning at a time from the RF pulse until acquisition, which defines an echo time (TE). This combination of pulses and echo acquisitions is repeated to define a repetition time (TR) until all desired lines of k-space are acquired. SE pulse sequences are often employed for a variety of clinical applications, for example, because the SE pulse sequence can be used for a variety of contrast weightings, including T1-, T2-, or proton density-weighted, by modifying the TE and TR.

The basic SE pulse sequence can be adapted. Images acquired with multiple spin echoes, are generally referred to by the name rapid acquisition with relaxation enhancement (RARE) pulse sequence, or the commercial names, such as fast spin echo (FSE) pulse sequence or turbo spin echo (TSE) pulse sequence. Also, special versions of these sequences have been developed that use longer echo trains to achieve even greater acceleration for snapshot imaging (e.g HASTE, SSFSE) or for volumetric 3D acquisitions (e.g. Cube and SPACE). Long echo trains can also be combined with gradient refocusing as in GRASE or stack of spirals sequences.

Generally speaking, these methods apply different spatial encoding to different RF refocused echoes to encode spatial information quickly and often to impart T2 contrast to the image. Because T2 decay causes signal intensity to differ between echoes, the Fourier space in which the images are encoded is modulated by the signal decay, resulting in a T2 dependent filtering. In long echo train images, this filtering distorts the point spread function (PSF), introducing blurring and potentially other artifacts in the images.

Two methods have been developed to address PSF distortions and the associated artifacts. One method applies a corrective multiplicative factor, or filter, in Fourier space before image reconstruction. Corrective filters have been used to achieve a desired PSF or using Wiener filter or singular value decomposition (SVD) methods.

The second method uses variably reduced refocusing flip angles during the echo train. By reducing the flip angles from 180°, some signal producing magnetization is stored in the longitudinal direction where it decays with the longer T1 relaxation time rather than T2.

In particular, the maximum practical length of the echo train is determined primarily by the T2 relaxation times of the tissues being imaged and the maximum allowable RF power deposition. When employing an MRI system having a 1.5 Tesla magnet, the length of a train of 180° refocusing RF pulses is limited practically to less than approximately 300 ms by the T2 decay. Refocusing RF pulses with flip angles of less than 180° have been used to reduce RF power deposition and to prolong the amount of time for which magnetization is available for refocusing. The use of reduced flip angles results in the temporary storage of magnetization in stimulated echo coherence pathways during which time the magnetization decays at the tissue's T1 relaxation rate instead of the T2 relaxation rate. Because T1 is significantly longer than T2 for most tissues, the use of refocusing RF pulses with smaller flip angles increases the amount of magnetization available for creating echoes later in the echo train and echo train lengths may be increased while maintaining signal. Reduced flip angles have the added benefit of reducing RF power deposition but can increase the vulnerability to motion artifacts.

Most variable flip angle design approaches have used heuristic methods based on intuition and simplicity to achieve a desired result. Typically, these methods incorporate assumptions of the pseudo steady state theory, such as described by Alsop (Magn Reson Med; 37:176-184 (1997), which is incorporated herein by reference in its entirety, which describes that gradual changes of the flip angle can be used to produce signal in an approximate steady state. However, given the widespread use of RARE acquisitions for clinical decision making, even a modest improvement of resolution, contrast, and signal to noise would have important diagnostic and societal implications so a more rigorous optimization is worthwhile.

SUMMARY

The present disclosure overcomes the aforementioned drawbacks by providing systems and methods for designing and performing pulse sequences that balance the above-described competing constraints.

In accordance with one aspect of the disclosure, a method is provided for acquiring magnetic resonance imaging (MRI) images of a subject. The method includes designing a pulse sequence to elicit spin echoes. The pulse sequence includes a radio frequency (RF) excitation pulse and a series of RF refocusing pulses that refocus echoes with flip angles in the series of RF refocusing pulses that are varied. The method also includes performing the pulse sequence to acquire MRI data from the subject and scaling MRI data associated with each echo by a correction factor that is determined for each echo to create scaled MRI data and that is not the same for all echoes. The method then includes reconstructing an image of the subject using the scaled MRI data.

In accordance with another aspect of the disclosure, a system is provided that includes a magnet system configured to generate a polarizing magnetic field about at least a portion of a subject and a magnetic gradient system including a plurality of magnetic gradient coils configured to apply at least one magnetic gradient field to the polarizing magnetic field. The system also includes a radio frequency (RF) system configured to apply an RF field to the subject and to receive magnetic resonance signals from the subject using a coil array and a computer system. The computer system is programmed to control the magnetic gradient system and the RF system to perform a pulse sequence to elicit spin echoes and acquire MRI data from the spin echoes. The pulse sequence includes a radio frequency (RF) excitation pulse and a series of RF refocusing pulses that refocus echoes where the flip angles of the RF refocusing pulses are not all the same. The computer system is further programmed to scale MRI data associated with each echo by a correction factor that is determined for each echo and that varies to create scaled MRI data and reconstruct an image of the subject using the scaled MRI data The foregoing and other aspects and advantages of the invention will appear from the following description. In the description, reference is made to the accompanying drawings, which form a part hereof, and in which there is shown by way of illustration a preferred embodiment of the invention. Such embodiment does not necessarily represent the full scope of the invention, however, and reference is made therefore to the claims and herein for interpreting the scope of the invention.

DETAILED DESCRIPTION

Figure 1:
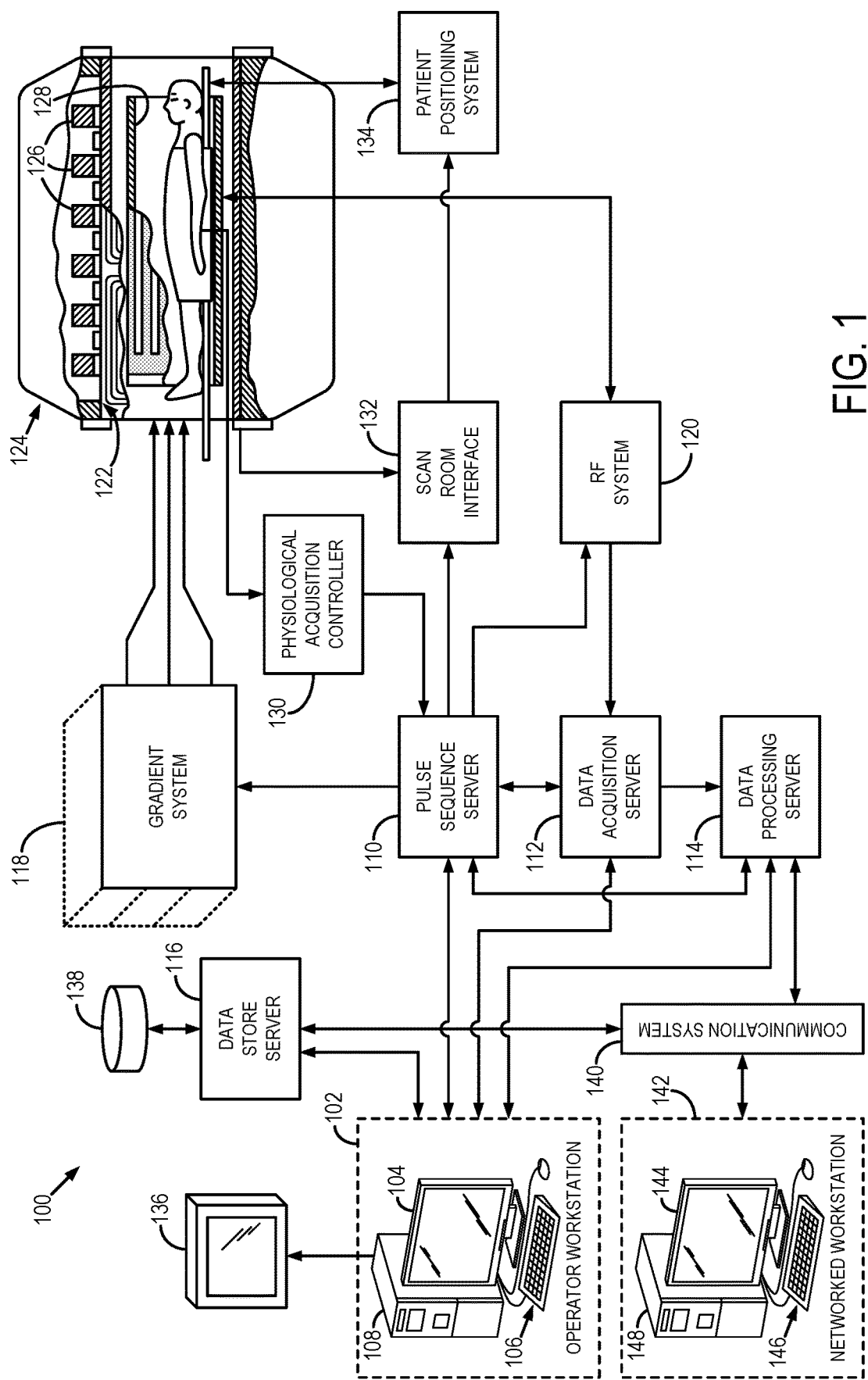
FIG. 1 is a block diagram of an example of a magnetic resonance imaging (MRI) system configured to employ the present disclosure.

The systems and methods disclosed herein allow for the designing of spin-echo-based pulse sequences or, for example, RARE echo trains and reconstruction filters to control competing constraints within the pulse sequence, such as finding a globally desirable or optimum signal-to-noise ratio (SNR) for a given targeted PSF. The systems and methods provided herein allow for incorporation of constraints on total RF power or minimum flip angles (to constrain motion and flow related signal loss). First, a general approach is described. A further generalization is then provided, where the optimization function changes from, for example SNR, and can be replaced by the CNR between two tissues of specified T2, T1, and PD or can be included a weighting in frequency space of the form:

$$Optfunc = \frac{\sum W(k)}{\sqrt{\sum Q(k)\left(\frac{W(k)}{S(k)}\right)^2}};\qquad\text{Eqn. 1}$$

where W(k) is the target response as a function of echo/k-space line, S(k) is the signal at that line, and Q(k) is a weighting function that priorities the importance of noise at different spatial frequencies. As will be described, this also presents a choice of phase ordering for the acquisition. Prior work has shown that detection accuracy for humans and computer algorithms is highest when the noise is distributed more towards high frequency (Burgess et al. Medical Physics 28, 419 (2001)), for example. Following these generalized examples, the concepts are applied to one, non-limiting clinical application of arterial spin labeling (ASL).

That is, the systems and methods of the present disclosure will first be described with respect to a non-limiting example of a clinical application that employs ASL for perfusion imaging. ASL perfusion imaging provides a non-invasive way to interrogate brain perfusion with quantified cerebral blow flow. The ASL signal is generated by inverting the natural existing water spin of blood, which decays as the blood flowing into brain tissue. Even with robust pseudo continuous ASL (PCASL) labeling design, ASL still suffers from lower SNR than other routine MR images. To improve the sensitivity of ASL and the efficiency of background suppression, the PCASL image is typically acquired with gradient and spin echo (GRASE) or stack-of-spiral, both of which are based on the RARE pulse sequence. In such 3D trajectories, each slice is covered by spiral or echo planar imaging (EPI) readout and all the slices are conventionally phases encoded along the same echo train.

Because of the long readout in fast trajectory imaging techniques, to achieve sufficient slice coverage in ASL, the total readout during the echo train commonly exceeds 3 times the T2 of brain tissue. Therefore, the T2 decay along the echo train can result in a distorted PSF, which introduces T2 blurring artifacts and degrades the resolution in slice direction. In addition to the inherent low resolution of ASL images, the poorly constrained wings of the PSF corrupt the appearance of coronal and sagittal images further and can lead to errors such as erroneously high flow in white matter. The blurring in sagittal and coronal planes makes the diagnosis on medial temporal lobes and inferior frontal lobes more challenging for neuroradiologists. Achieving high resolution in the slice direction would improve the image quality in an oblique slice, 3D structure registration, and segmentation, which are resliced by numerical interpolation.

To control against these T2 blurring artifacts, some researchers proposed to avoid the fast spin echo acquisition. The gradient echo based EPI pulse sequence can circumvent T2 blurring, but it suffers from spatial distortion and T2* related blurring. Some have proposed using simultaneous multi-slice (SMS) acquisition instead of 3D acquisition for PCASL implementations. However, it is challenging to perform high-efficiency background suppression in a multi-slice sequence. Besides the pitfalls mentioned above, the inherently low SNR of gradient-echo based sequences is also an obstacle in this application of ASL.

As such, others have focused on the fast spin echo (FSE) pulse sequence and developed several strategies to reduce the T2 blurring. The first category of methods was targeted to correct the disturbed PSF. Since the MRI signal is not band limited, the signal with the limited coverage of k-space will provide a sinc function for PSF. Many clinicians prefer non-filtered images, because Gibbs ringing in the sinc function can actually enhance the definition of boundaries and, thus, improve visual detection. However, quantitative functional methods like ASL may emphasize SNR and the localization of average values rather than edge detection. In quantitative images, k-space filtering, using the Hann or Fermi windows, can reduce the ringing of the PSF. A simple approach of reducing T2 blurring is to correct the attenuated signal in later echoes to desired windows before reconstruction. The performance of the correction, however, is limited by the amplification of the high frequency noise. Previous work proposed estimating the PSF from images and correcting the blurring by an iterative deconvolution method. Alternative assumptions of images features can be employed with compressed sensing method, which help to suppress the noise and reduce the T2 blurring. However, these iterative correction methods are generally parametrically dependent and computationally complex. Thus, controlling for the distributed PSF requires a tradeoff for other sacrifices to the images or, at a minimum, extensive reconstruction times.

In addition to these post-correction methods, some have proposed strategies for reducing the T2 blurring by shortening the echo train length using FSE sequence. One approach is to use multi-shot acquisitions, which either increases the number of interleaves directly or reorders the readout as using a periodically rotated overlapping parallel lines with enhanced reconstruction (PROPELLER-) based technique. Both methods redistribute the time spent on averaging to acquiring data of fractions of k-space, which won't prolong the scan time of common perfusion imaging, but does reduce the temporal resolution for functional studies. Thus, some proposed to achieve high temporal resolution with parallel imaging, but the undersampled k-space data results in unavoidable loss of the SNR.

Counterintuitively, the present disclosure provides systems and methods to overcome the problem of T2 blurring, even in the challenging context of ASL imaging, by developing a variable flip angle scheme that is employed during the refocusing pulses of a RARE or SE-based pulse sequence. Traditionally, RARE and other such sequences were implemented with short echo spacing and short echo train length. Thus, the flip angle was primarily designed to provide constant signal amplitude in 'pseudo steady states', where the T2 decay plays a minor role and, in some cases, can be neglected. Based on the SAR limitation and magnetization transfer effect, the asymptotic constant small flip angle was suggested in the conventional flip angle design used in FSE pulse sequences. However, the present disclosure recognizes that this may result in a sub-optimal design when the T2 decay becomes the inevitable problem, which is the case in 3D ASL imaging and other settings where the PSF distribution is implicated, as described above.

As described herein, T2 blurring can be controlled and reduced by designing a variable flip angle scheme, which yields the signal evolutions following a targeted window function. The design of reduced flip angle trains, however, has generally been performed using heuristic methods, rather than systematic methods. For example, variable flip angles schemes have been proposed in an intuitive way by designing the maximum signal at the last echo or to attempt to maintain constant signal until the center of k-space center is acquired and then the flip angles are increased linearly. The performance of this design depends on the clinician's experience and it does not provide a generalized solution of variable flip angle design.

The present disclosure provides systems and methods to achieve desired or optimal SNR with the combined design of flip angle and echo scaling correction across clinical application and or RARE- or SE-based pulse sequences. That is, a general framework is provided for variable flip angle design, which can provide a globally selected or optimized solution to control blurring and optionally to control SAR or other competing constraints. The systems and methods of the present disclosure have been demonstrated by designing a flip angle, which achieves optimal SNR in window scaling corrections.

Before turning to specific examples of the techniques in accordance with the present disclosure, it is noted that the techniques described herein may be implemented using any of a variety of nuclear magnetic resonance (NMR) systems and MRI systems. Referring particularly to FIG. 1, an example of an MRI system 100 is illustrated. The MRI system 100 includes a workstation 102 having a display 104 and a keyboard 106. The workstation 102 includes a processor 108 that is commercially available to run a commercially-available operating system. The workstation 102 provides the operator interface that enables scan prescriptions to be entered into the MRI system 100. The workstation 102 may be connected to four servers: a pulse sequence server 110; a data acquisition server 112; a data processing server 114; and a data store server 116. These servers may be virtual or physical. The workstation 102 and each server 110, 112, 114, and 116 are connected to communicate with each other.

The pulse sequence server 110 functions in response to instructions downloaded from the workstation 102 to operate a gradient system 118 and a radiofrequency (RF) system 120. Gradient waveforms necessary to perform the prescribed scan are produced and applied to the gradient system 118, which excites gradient coils in an assembly 122 to produce the magnetic field gradients $G_x$, $G_y$, and $G_z$ used for position encoding MR signals. The gradient coil assembly 122 forms part of a magnet assembly 124 that includes a polarizing magnet 126 and a whole-body RF coil 128 or a local coil.

RF excitation waveforms are applied to the RF coil 128, or a separate local coil, such as a head coil, by the RF system 120 to perform the prescribed magnetic resonance pulse sequence. Responsive MR signals detected by the RF coil 128, or a separate local coil, are received by the RF system 120, amplified, demodulated, filtered, and digitized under direction of commands produced by the pulse sequence server 110. The RF system 120 includes an RF transmitter for producing a wide variety of RF pulses used in MR pulse sequences. The RF transmitter is responsive to the scan prescription and direction from the pulse sequence server 110 to produce RF pulses of the desired frequency, phase, and pulse amplitude waveform. The generated RF pulses may be applied to the whole body RF coil 128 or to one or more local coils or coil arrays.

The RF system 120 also includes one or more RF receiver channels. Each RF receiver channel includes an RF preamplifier that amplifies the MR signal received by the coil 128 to which it is connected, and a detector that detects and digitizes the quadrature components of the received MR signal. The magnitude of the received MR signal may thus be determined at any sampled point by the square root of the sum of the squares of the I and Q components:

$$M=\sqrt{I^2+Q^2}$$ Eqn. 2;

and the phase of the received MR signal may also be determined:

$$\varphi = \tan^{-1}\left(\frac{Q}{I}\right).$$ Eqn. 3

The pulse sequence server 110 also optionally receives patient data from a physiological acquisition controller 130. The controller 130 receives signals from a number of different sensors connected to the patient, such as electrocardiograph (ECG) signals from electrodes, or respiratory signals from a bellows or other respiratory monitoring device. Such signals are typically used by the pulse sequence server 110 to synchronize, or "gate," the performance of the scan with the subject's heart beat or respiration.

The pulse sequence server 110 also connects to a scan room interface circuit 132 that receives signals from various sensors associated with the condition of the patient and the magnet system. It is also through the scan room interface circuit 132 that a patient positioning system 134 receives commands to move the patient to desired positions during the scan.

The digitized MR signal samples produced by the RF system 120 are received by the data acquisition server 112. The data acquisition server 112 operates in response to instructions downloaded from the workstation 102 to receive the real-time MR data and provide buffer storage, such that no data is lost by data overrun. In some scans, the data acquisition server 112 does little more than pass the acquired MR data to the data processor server 114. However, in scans that require information derived from acquired MR data to control the further performance of the scan, the data acquisition server 112 is programmed to produce such information and convey it to the pulse sequence server 110. For example, during prescans, MR data is acquired and used to calibrate the pulse sequence performed by the pulse sequence server 110. Also, navigator signals may be acquired during a scan and used to adjust the operating parameters of the RF system 120 or the gradient system 118, or to control the view order in which k-space is sampled. In all these examples, the data acquisition server 112 acquires MR data and processes it in real-time to produce information that is used to control the scan.

The data processing server 114 receives MR data from the data acquisition server 112 and processes it in accordance with instructions downloaded from the workstation 102. Such processing may include, for example: Fourier transformation of raw k-space MR data to produce two or three-dimensional images; the application of filters to a reconstructed image; the performance of a backprojection image reconstruction of acquired MR data; the generation of functional MR images; and the calculation of motion or flow images.

Images reconstructed by the data processing server 114 are conveyed back to the workstation 102 where they are stored. Images may be displayed on the operator display 104 or a display 136 that is located near the magnet assembly 124 for use by attending physicians or other clinicians. Batch mode images or selected real time images are stored in a host database on disc storage 138. When such images have been reconstructed and transferred to storage, the data processing server 114 notifies the data store server 116 on the workstation 102. The workstation 102 may be used by an operator to archive the images, produce films, or send the images via a network or communication system 140 to other facilities that may include other networked workstations 142.

The communication system 140 and networked workstation 142 may represent any of the variety of local and remote computer systems that may be included within a given clinical or research facility including the system 100 or other, remote location that can communicate with the system 100. In this regard, the networked workstation 142 may be functionally and capably similar or equivalent to the operator workstation 102, despite being located remotely and communicating over the communication system 140. As such, the networked workstation 142 may have a display 144 and a keyboard 146. The networked workstation 142 includes a processor 148 that is commercially available to run a commercially-available operating system. The networked workstation 142 may be able to provide the operator interface that enables scan prescriptions to be entered into the MRI system 100.

The systems and methods can be implemented using systems, such as the MRI system 100 of FIG. 1. In particular, a systematic variable flip angle design framework is provided to control against T2 blurring by combining flip angle design and window scaling correction. As will be described, the systems and methods offer control and reduction of image blurring when compared to the conventional constant amplitude methods. Also, the systems and methods provided herein can provide significantly superior SNR.

Figure 2:
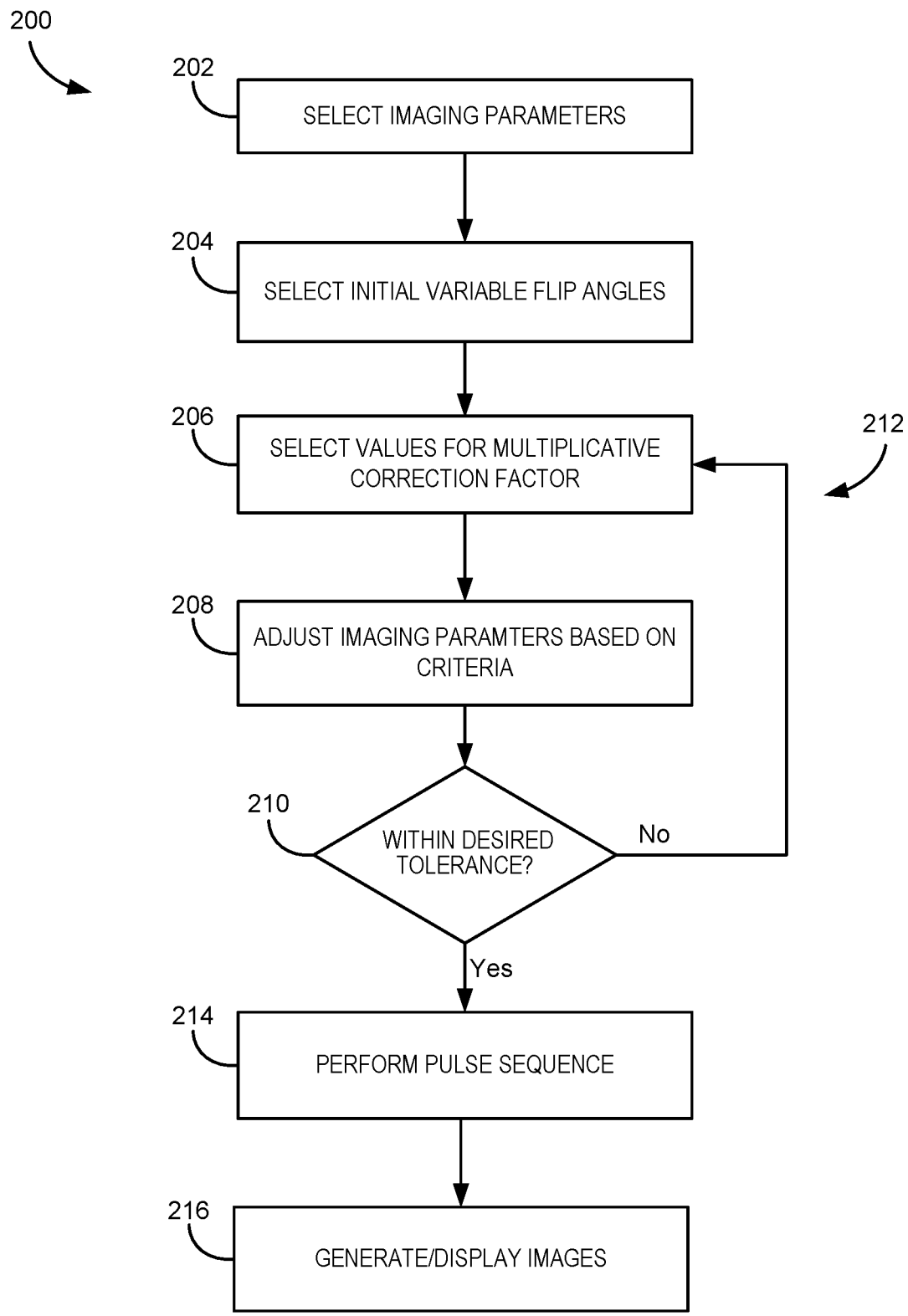
FIG. 2 is a flow chart setting forth the steps of one non-limiting example of a method for generating improved medical images according to the present disclosure.

Referring to FIG. 2, a framework 200 for variable flip angle design is provided, which provides a globally optimized solution to control blurring and optionally to control SAR or other competing constraints. Specifically, at process block 202 imaging parameters are selected by a clinician. Such parameter selection may include selection of the underlying pulse sequence, such as a variation on the RARE pulse sequence or the like. Furthermore, at process block 204, the clinician may select initial values for the variable flip angles. Alternatively, the initial values for the variable flip angles may be selected by a computer system, such as described above. A process block 206, initial values of a multiplicative correction factor that is different for each echo may be selected. In particular, the pulse sequence is designed to elicit a series of RF-refocused echoes after an excitation where the refocusing pulse flip angles are different for each echo and the acquired echo signals are scaled by a multiplicative correction factor that is different for each echo. In some configurations, each echo may be spatially encoded with a different phase encoding gradient. In this situation, the echo dependent multiplicative correction factor can be a considered a filter applied to the image, since phase encoded data is acquired in Fourier or k-space.

At process block 208, the refocusing flip angles and multiplicative correction factors may be chosen based on magnetic resonance physics simulations to optimize imaging parameter selection based on a combination of criteria. Such criteria may include one or more of image resolution (or point spread function) for at least one tissue with specified relaxation times, image signal to noise ratio, image contrast to noise ratio, deposited radiofrequency power, minimum flip angle (that may affect motion related signal loss), and the like. Thereafter, at decision block 210, a check is made to determine if the selected imaging parameters satisfy tolerances selected for the one or more criteria. For example, a numerical optimization method may be utilized to find the maximum or minimum value of a mathematical objective function designed to reflect the optimization criteria. In this case, the preceding steps may be reiterated through loop 212.

For example, control of blurring and T2 contrast in echo train imaging for T2 weighting imaging may be an underlying goal. One approach to optimizing for T2 weighting is to target a particular evolution of filtered signal difference between two tissues types with different T2, T1, and proton density (PD). This forces a choice of phase ordering for the acquisition. For example, the optimization function can be given by:

$$\sum \left(\frac{W}{S_1 - S_2}\right)^2; \quad \text{Eqn. 4}$$

where W is the desired window function and S1 and S2 are the signals from tissue 1 and tissue 2, respectively. Assuming a linear phase ordering so the center of k-space is in the middle of the echo train, a symmetric target window can be chosen, like a constant, Fermi, or Hanning window, or an asymmetric one, such as a linear ramp added to a constant. Other phase orderings, including partial Fourier, or a cyclically shifted centric can also be used.

The global optimization produces a highly variable flip angle train that achieves the desired window response for difference between tissues by a combination of variable flip angles and filters applied to the reconstruction. Generalizations of this objective function are also possible. When a particular window response is targeted for one signal or signal difference, the filter functions, f, can exactly achieve the desired response. However, flexibility can be provided by letting the f functions vary to enable trading off strict point spread function for SNR, or other criteria. For example an objective function of the following form can be used:

$$\Sigma((W-fS)^2+\lambda f^2) \quad \text{Eqn. 5;}$$

which allows for trading off the perfection of achieving the target window function, indicated by the first term, and the noise, the second term, with the weighting lambda used to adjust the emphasis on noise relative to the accuracy of achieving the target point spread function. This can also be used to add additional tissues to the optimization by summing multiple such objective functions.

As another example, the multiplicative correction factor may be selected to correct the echo signals to achieve a desired overall filtering (or windowing function) applied to the image for an assumed set of tissue relaxation times. As but one non-limiting example, this may be achieved using the following:

$$f_i = \frac{w_i}{S_i}; \quad \text{Eqn. 6}$$

where $w_i$ is the value of the target window function at echo i, $S_i$ is the signal at echo i for the particular train of refocusing pulse amplitudes and assumed relaxation times, and $f_i$ is the multiplicative scale factor for echo i. The objective function may be monotonically related to the voxel signal-to-noise ratio by:

$$SNR^2 = \frac{\sum_i (f_i S_i)^2}{\sum_i (f_i n)^2} = \frac{\sum_i (w_i)^2}{\sum_i \left(\frac{w_i}{S_i} n\right)^2}; \quad \text{Eqn. 7}$$

where n is the thermal noise at each echo.

As another non-limiting example, the objective function may be monotonically related to the voxel signal-to-noise ratio plus a weighted factor reflecting the deviation of the corrected signal from a target window, such that:

$$func = \frac{\sum_i (f_i S_i)^2}{\sum_i (f_i n)^2} - \lambda \sum_i (w_i - f_i S_i)^2; \quad \text{Eqn. 8}$$

where λ is a weighting function selected by the user, such as at process block 202.

As still another non-limiting example, the multiplicative correction factor may be selected to correct a difference between echo signals from two different tissue with different relaxation times and proton density to achieve a desired overall filtering (or windowing function) applied to the contrast in the image, such that:

$$f_i = \frac{w_i}{S_i^1 - S_i^2};$$  Eqn. 9 where $w_i$ is the value of the target window function at echo i, the $S_i$ is the signal at echo i for each of the two tissues for the particular train of refocusing pulse amplitudes, and $f_i$ is the multiplicative scale factor for echo i. The objective function is monotonically related to the voxel contrast-to-noise ratio by:

$$CNR^2 = \frac{\sum_i (f_i(S_i^1 - S_i^2))^2}{\sum_i (f_i n)^2} = \frac{\sum_i (w_i)^2}{\sum_i \left(\frac{w_i}{S_i^1 - S_i^2} n\right)^2};$$  Eqn. 10 where n is the thermal noise at each echo.

As still another non-limiting example, the flip angles and scale factors may be optimized to achieve a targeted T2 weighting as defined by an effective TE at each echo. This effective TE can be defined, for example, as a derivative of the logarithm of the echo signals from a particular assumed tissue with respect to T2 or R2 (the tissue transverse relaxation time or rate) which characterizes the effective TE at each echo, $$TEeff_i = -\frac{d}{dR_2}(\ln(S_i)) = -\frac{1}{S_i}\frac{dS_i}{dR_2}.$$  Eqn. 11

Desired T2 weighting can be achieved by constraining TEeff at the echo where the center of k-space is encoded to be at or near the targeted value, or by adjusting the k-space encoding order such that the center of k-space is encoded at the echo where TEeff is closest to the desired value. The flip angles and scale factors for other k-space encodes can be optimized for SNR, resolution and other criteria as in the non-limiting examples above.

Also, the objective function may be a combination (by addition, multiplication, or similar mathematical combination) of the above to address combinations of criteria including SNR, CNR and window deviation terms.

The tolerance considered at process block 210 may constrain various selections. For example, it may constrain the maximum or minimum refocusing flip angle and/or the sum of squares of the flip angle (proportionally to deposited radiofrequency power). The above-described optimizations may be adjusted to add a weighted effect of power deposition given by:

$$func_{new} = func - \lambda_a \sum_i (F_i)^2;$$  Eqn. 12 where Fi is the refocusing flip angle for echo i. Also, the tolerance at process block 210 may impart a spatial frequency dependent weighting to the noise calculation to reflect better reader or computer algorithm performance or acceptance with a particular spatial frequency distribution of noise.

In some configurations, it is contemplated that the objective function, the tissue relaxation parameters, number of echoes, and/or any weights may be specified by the sequence designer at process block 202, which results in an implementation with fixed flip angles and correction factors. Alternatively, some of the objective function, the tissue relaxation parameters, number of echoes, and/or any weights may be specified by the user or local expert at process block 202, resulting in flip angles and scale factors customized to the user's preferences, needs, or objectives.

Once the preceding process steps have been completed, the pulse sequence is performed at process block 214, for example, using the MRI system of FIG. 1, and then images are generated at process block 216 from the imaging data acquired using the pulse sequence. Namely, as described process block 216 may include reconstructing the data to produce or generate images from the imaging data and/or displaying images generated from the imaging data.

Example I

The above-described framework is design to present VFA as an optimization problem. As described, the above-described systems and methods have demonstrated a 40% or greater SNR improvement in T2 blurring correction. This framework can be extended to provide simultaneous control of T2 blurring and contrast in abdominal imaging. That is, the above-described systems and methods can be extended to reduce blurring while controlling contrast in abdominal imaging with variable flip angle single shot fast spin echo techniques.

Method

This study proceeded in 2 stages. First, we designed variable flip angle trains for RARE acquisitions using 3 different schemes: (1) achieving constant signal neglecting T2 decay by flip angle modulation, (2) achieving targeted signal response including T2 decay by flip angle modulation, and (3) achieving targeted signal response including T2 decay by a combination of flip angle modulation and k-space filtering. Second, we assessed the performance of the proposed designs with simulations and in vivo 3D ASL images obtained in healthy volunteers.

Flip Angle Designs

Three flip angles schemes were designed for the parameters of a typical 3D ASL configuration. Echo train length was set to 32 and echo spacing was 10 ms. Centric phase encoding was specified and the T2 and T1 of gray matter were assumed to be 100 ms and 1600 ms. An extended phase graph algorithm was used to calculate the signals for all of the designs.

A flip angle train providing constant amplitude signal when T1 and T2 are neglected was designed targeting a 95 degree asymptotic flip angle. This asymptotic constant amplitude flip angle scheme has been used commonly in clinical and research studies and was used as a benchmark for this study. This method will be referred to as "Constant" in the following.

Two variable flip angle trains were designed, including T1 and T2 decay, which can directly achieve Hann or Fermi window-shaped amplitudes across the echo train. Because the desired signal response cannot be achieved for an arbitrarily high amplitude, echo trains were iteratively calculated as the first echo amplitude was gradually increased from zero until the target shape of response could not be achieved. This method will be referred to as "Direct" in the following.

For our study, the Fermi window is defined as:

$$W_i = \frac{1}{1+\exp\left(\frac{i-xN}{kN}\right)};$$ Eqn. 13 where i is the echo number (starting with 1), and N=32 is the number of echoes. Other parameters are x=9 and k=0.046.

Using both variable flip angles and k-space filtering provides additional flexibility to optimize the SNR performance of the acquisition. Because k-space filtering can be used to convert the signals of any acquired echo train to a target response, a wide range of potential flip angle trains is able to provide acceptable signals. The corrected signal with optimal SNR performance was selected by minimizing the cost function below.

A mathematical expression for the SNR of an image was used for the optimization, assuming the acquired RARE signal is $S_i$ for the ith echo and $S_0$ is the echo acquired at the center of k-space. Before applying the filter, the SNR can be defined as the ratio between signal amplitude and noise level:

$$SNR = c\frac{S_0}{\sigma};$$ Eqn. 14 where c is a calibration factor and σ is the standard deviation (SD) of the thermal noise.

When the k-space signal is filtered to match the target k-space window function ($W_i$) (e.g., Hann or Fermi window), each echo signal is multiplied by the scaling factor (Wi/Si). The signal amplitude becomes Wi. The noise amplitude is also scaled by the factors of Wi/Si and the SD of noise becomes $$\sigma\sqrt{\sum\left(\frac{W_i}{S_i}\right)^2}.$$

The SNR of the resulting image can be expressed as:

$$SNR = c\frac{1}{\sigma}\frac{W_0}{\sqrt{\sum\left(\frac{W_i}{S_i}\right)^2}}.$$ Eqn. 15

Because the SNR depends only on the signal (Si) in Eqn. 15, the maximum SNR can be achieved by minimizing the cost function as follows:

$$\hat{S} = \operatorname{argmin}\sum\left(\frac{W_i}{S_i}\right)^2.$$ Eqn. 16

The next step is to find the variable flip angle that can achieve the desired signal by minimizing this cost function. Because the echo amplitude of RARE depends on the history of flip angles, the optimal flip angles can be calculated by minimizing the cost function for each flip angle sequentially. However, because the flip angles are not independent, this sequential solution may limit the performance of later flip angles and result in a local minimum solution that does not provide the best design. In our implementation, all flip angles, including the corresponding k-space scaling factors, were designed together with a global optimization algorithm (GlobalSearch) provided by MATLAB (MathWorks, Natick, Mass.). 46 The inputs of this implementation were the target k-space window (W), echo spacing, and relaxation rates (T1 and T2), and the outputs were variable flip angles and scaling factors used in k-space filtering.

In addition to maximizing SNR, reduction of deposited RF field power or specific absorption rate (SAR) is often another goal of the variable flip angle design. 47 Limitation of SAR can be imposed with an additional constraint on the optimization, using the sum of squares of the flip angles u as follows:

$$\Sigma\theta_i^2 < SAR$$ Eqn. 17.

In this study, 2 flip angle schemes were designed for Hann and Fermi window corrections with maximum flip angle 150 degrees. This method will be referred to as "Optimal" in the following. Two additional optimal flip angle schemes were designed for Hann and Fermi window corrections, with both maximum flip angle 150 degrees and SAR limited to 50% of that in the benchmark Constant method. This method will be referred to as "50% SAR" in the following.

Assessment of Flip Angle Train Performance

The echo signals of these flip angle schemes were simulated with the extended phase graph algorithm. The performances of the proposed designs were quantified as follows.

The total signal of each design was calculated as the summation of all of the echo amplitudes. The SNR of each flip angle train corrected to each target window was calculated using Eqn 15. The results were normalized to the SNR of the constant amplitude method. The relative SAR of each flip angle scheme was calculated using Eqn. 17 and normalized to that of the Constant method.

The sensitivity of echo amplitudes to RF imperfections was also evaluated. RF miscalibration and especially spatial nonuniformity can be substantial at higher field strengths. Some variable flip angle designs could have increased sensitivity to RF variations, which might be a limitation to the performance of the proposed methods. The deviation of the echo signal was quantified as a normalized root mean squared error (RMSE) with Equation 6. Because the deviation can be amplified by k-space scaling, the deviations were also calculated after the designed scaling factors were applied to the signals, as follows:

$$\sqrt{\frac{\operatorname{mean}((S - S_{design})^2)}{\operatorname{mean}(S_{design}^2)}};$$ Eqn. 18 where $S_{design}$ are the echo signals of the designed flip angles, and S are the signals generated when the rotating RF magnetic field, B1, increased or decreased by 15%.

For in vivo assessment, healthy volunteers were recruited following a protocol approved by our institutional review board, and written informed consent was obtained from all subjects. The study was performed on a 3T GE MR750 scanner (GE Healthcare, Chicago, Ill.) with the body transmit coil and a 32-channel head receiver coil. Anatomic images were first acquired with fast spoiled gradient-echo (FSPGR) BRAVO in approximately 5 minutes for each volunteer.

The proposed method was evaluated on 6 subjects with unbalanced pseudocontinuous ASL. The ASL was performed with labeling duration 1450 ms and post-labeling delay of 1525 ms. The duration of labeling Hann RF pulses was 500 us. For the labeling, the average B1 was 1.4 uT, averaged gradient was 0.7 mT/m and the selective gradient was 7 mT/m. The ASL images were acquired by interleaved 3D stack-of-spiral RARE. Each slice was fully sampled by spiral trajectory and different slices were phase encoded. The spiral trajectory consisted of 8 arms, which provided 3.6 mm×3.6 mm in-plane resolution for a 240 mm×240 mm FOV. The readout length of each spiral arm was 4.1 ms. The same arm of the spiral was acquired for all echoes of an excitation, while slice-direction phase encoding was performed across echoes. The 8 different spiral arms were acquired with 8 different excitations. Thirty-two slices were acquired with slice thickness of 4 mm. Four pairs of control and label images were acquired in approximately 6 minutes. Repetition time (TR) was 4.5 seconds. Echo time (TE) and echo spacing were 10.5 ms. A reference scan, which was used for cerebral blood flow (CBF) quantification, was also performed with the same readout parameters and flip angle scheme.

The present method was also examined on T1 weighted images, as the blurring measurement algorithm could be inaccurate when applied to the low SNR ASL images. To achieve an "ASL-like" contrast, the T1-weighted images were prepared by 4 saturation pulses at the beginning of the sequence and 3 frequency offset corrected inversion (FOCI) pulses at 2980, 704, and 112 ms before the excitation pulse. This timing nulled the CBF signal and produced a much larger gray matter than white matter signal. The images were acquired with the same readout as the ASL sequence, with a longer 6-second TR.

RF inhomogeneity was measured on 1 healthy volunteer with a double flip angle method. Three-dimensional images were acquired with the same readout as ASL. Scans were repeated with excitation flip angles of 90 degrees and 45 degrees the excitation pulses, whereas the same constant amplitude flip angles were used in the refocusing pulses of RARE. The images were smoothed by a 3D Gaussian filter with $\sigma=55.6$ mm, and actual flip angles were quantified. The effective flip angle was measured as the mean of the actual flip angle of the whole brain.

All ASL and T1-weighted images were reconstructed with MATLAB 2015a. To correct the T2 blurring, the acquired data were scaled by the ratio of Hann or Fermi window to the simulated echo signal of each flip angle scheme. The corrected k-space data were 1D Fourier transformed along the slice direction, then nonuniform Fourier transformed in the slice plane to reconstruct images with a nominal matrix size of 128×128.

Signals were evaluated using spatial masks derived from the T1-weighted, FSPGR BRAVO images. Gray and white matter masks were generated by segmenting the anatomic images with a probability map in SPM12 (Wellcome Trust Centre for Neuroimaging, London). The segmented gray matter mask was coregistered with the ASL images, and the white matter mask was transformed accordingly. The CBF maps were quantified by assuming that the postlabel delay was longer than the arterial transit time:

$$f = \frac{\Delta M}{M_0} \frac{\lambda}{2\alpha T_1} \frac{1}{\exp\left(-\frac{w}{T_1}\right) - \exp\left(-\frac{w+\tau}{T}\right)}; \quad \text{Eqn. 19}$$

where $\Delta M$ is the ASL difference signal between control and label scans; M is the signal of reference scan; f is the CBF; k is the brain blood partition coefficient (assumed to be 0.9); $\alpha$ is the labeling efficiency (0.8); $T_1$ is the longitudinal relaxation factor of tissue (1600 ms); w is the post-labeling delay (1525 ms); and s is the labeling duration (1450 ms). The perfusion was measured as the mean of the gray matter and white matter region for each subject. The SD across subjects was also calculated.

The SNR was quantified on ASL images to enable comparison across the methods. The signal level was measured as the mean across all gray matter regions in the whole brain. The noise level is difficult to measure with ASL images, in which physiologic noise accounts for an essential proportion. Here, we calculated noise in 2 steps. First, the temporal differences between the first 2 and last 2 repetitions of ASL images were calculated. Second, the spatial SD was calculated from a region outside the head on the temporal difference images. Contrast was calculated as the ratio between the mean signal of gray and white matter in the ASL images. The improvements of SNR were statistically evaluated among methods by a paired Wilcoxon signed rank test.

The reduction of blurring was evaluated using a non-reference method, which measured the difference of spatial variance before and after applying a low-pass filter. We performed the blurring measurement on the high SNR T1-weighted images to avoid the influence of the low SNR of ASL images. This non-reference blurring metric was modified to measure the blurring only in the slice direction. The blurring of the central 64 coronal slices was quantified and averaged. The blurring metric was scaled from 0 to 100, in which a larger value of the blurring metric indicates a more blurred image.

Results: Overview

As described above, we demonstrated that different flip angle design algorithms produced very different flip angles and echo train amplitudes. As expected, the Constant method resulted in high amplitude signal at the first echo, but the signal dropped quickly in the later echoes at a rate close to T2. In contrast, the Direct method with only variable flip angles used lower flip angle pulses in the early part of the echo train, to distribute the echo signal according to the correction windows. The proposed Optimal method used larger flip angles at the first few and later RF pulses.

The SNR improvement of the proposed Optimal method was moderate in the Hann window correction, and approximately 50% higher in the Fermi window correction, compared with the conventional approaches. However, it also resulted in a 48% SAR increase in the Hann window correction. With the added SAR constraint, the proposed 50% SAR method precisely achieved 50% SAR of the Constant method and maintained the superior SNR performance. The Direct method resulted in the lowest SAR, but intermediate SNR.

The RF amplitude sensitivity of the proposed Optimal method was moderate. Before the k-space filtering, the signal profile of the Optimal method showed slightly more deviation than the Constant method, which suggested more RF sensitivity. With 15% RF reduction, the echo amplitude of the Constant method deviated 8.4%, while the proposed methods deviated 9.7% (10.5% when SAR was constrained)

in the designs for Hann window correction. In contrast, the Direct method showed greater deviation (11.8%). After the correction with k-space scaling factors, the proposed Optimal method also displayed more sensitivity to RF amplitude than the Constant design. The proposed 50% SAR method, however, maintained a similar B1 sensitivity as the Constant method.

Theoretical blurring of the Constant method echo trains and corrections with k-space filtering were calculated by the edge rise distance (10-90%). 54 The results are normalized to the case in which k-space is corrected to a box function. The relative edge rise distances are 4.3, 1.8, and 1.1 for the uncorrected Constant Hann and Fermi windows, respectively. This indicates reduced blurring in Hann and Fermi window corrections.

Results: Detailed Description
Flip Angle Design and Performance

Figure 3A:
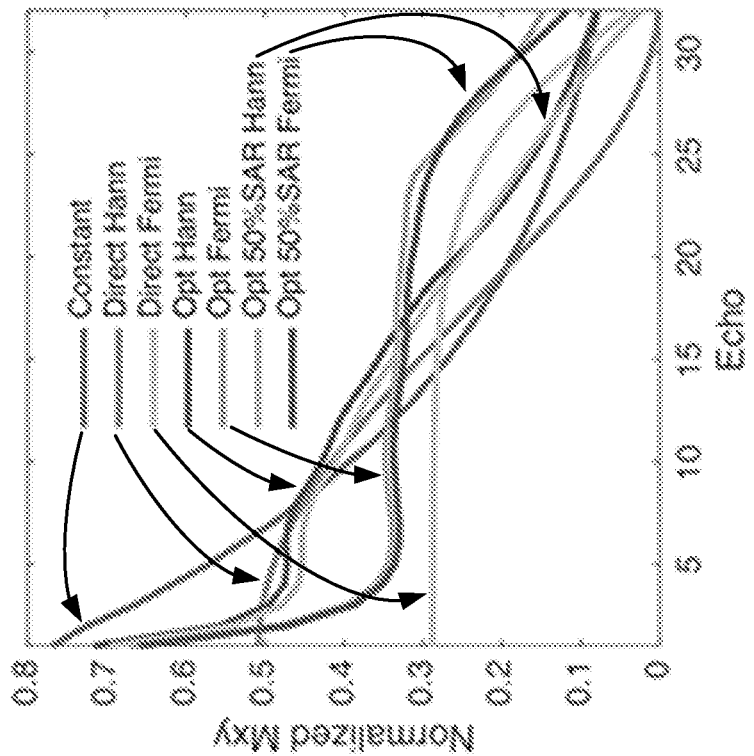
FIG. 3A is a graph of flip angle versus RF pulse comparing systems and methods of the present disclosure with traditional methods.
Figure 3B:
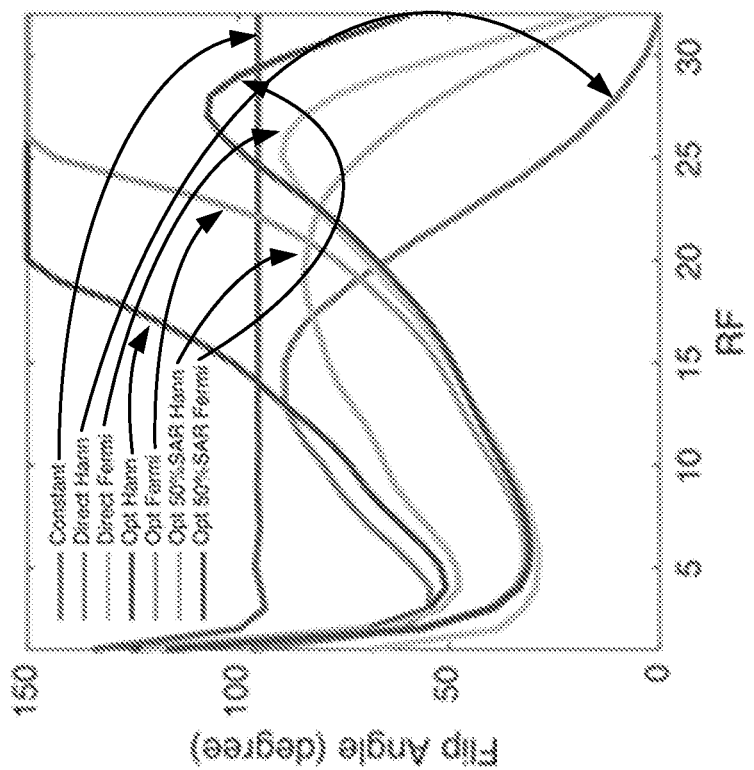
FIG. 3B is a graph of normalized Mxy versus echo comparing systems and methods of the present disclosure with traditional methods.

FIGS. 3A and 3B show the designed flip angle schemes and the resulted responses along slice direction, respectively. The constant amplitude method had high signal at the first echo, but the signal dropped quickly in the later echoes. In contrast, the proposed optimal design attempted to employ larger flip angle at the later RFs. When we considered the SNR as the summation of kspace signal, the proposed designs resulted in 4-5% higher signal level over k-space than the constant amplitude method, Table 1.

TABLE 1

|       | %           | Total Signal | SAR   | SNR with correction |
|-------|-------------|--------------|-------|---------------------|
| Hann  | Constant    | 100          | 100   | 100                 |
|       | Direct      | 86.0         | 42.4  | 84.5                |
|       | Optimal     | 104.5        | 148   | 111.4               |
|       | Opt 50% SAR | 99.7         | 50.0  | 107.3               |
| Fermi | Constant    | 100          | 100   | 100                 |
|       | Direct      | 79.7         | 35.5  | 118                 |
|       | Optimal     | 105.5        | 94.1  | 153                 |
|       | Opt 50% SAR | 102.4        | 50.0  | 149                 |

Optimal design for Hann window resulted in dramatic SAR increase (148), compared to that of the constant amplitude (100). Further design with SAR constraint, the proposed method well maintained SAR to 50% of the constant amplitude method. The SNR improvement of the proposed method was moderate in the Hann window correction and it is more dramatic in the Fermi window correction. In both window corrections, the flip angle with direct target window responses resulted in low SNR.

Figures 4A, 4B:
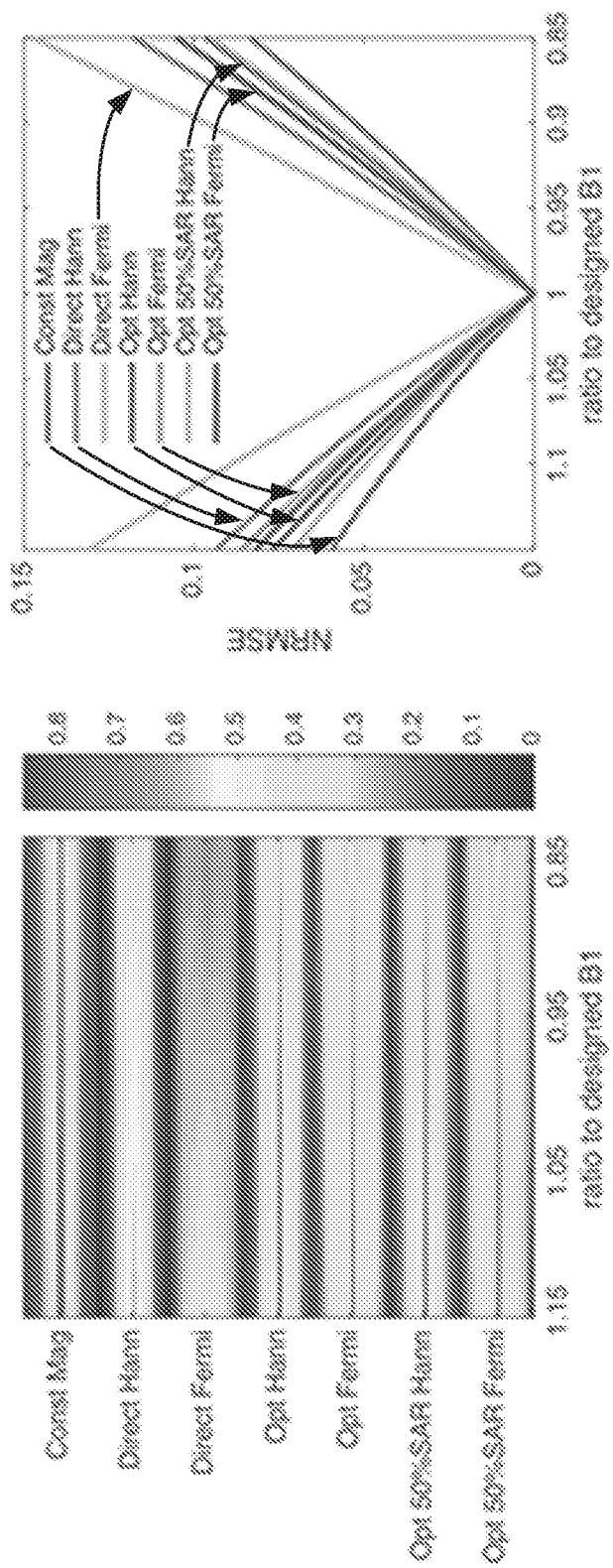
FIG. 4A is diagram of a B1 effect (x-axis) on the signal profile across slice (y-axis), where the colorbar stands for the normalized Mxy signal.
FIG. 4B is a graph of normalized deviation of signal response according to B1 levels.

The B1 sensitivity of the proposed methods is shown in FIGS. 4A and 4B. Similar to the constant amplitude method, the signal of the proposed flip angle schemes, especially the center of kspace, decreased with B1 (x-axis), which is illustrated in FIG. 4A. The signal profile of the proposed flip angles showed slightly more deviation than the constant amplitude method, which suggested more B1 sensitivity and is illustrated in FIG. 4B. With 15% B1 deficiency, the profile of the resulted signal in constant amplitude method deviated about 8% and the propose method decreased about 10%. However, the direct target window response design showed largely the profile distortion (12%-15%).

Figure 5:
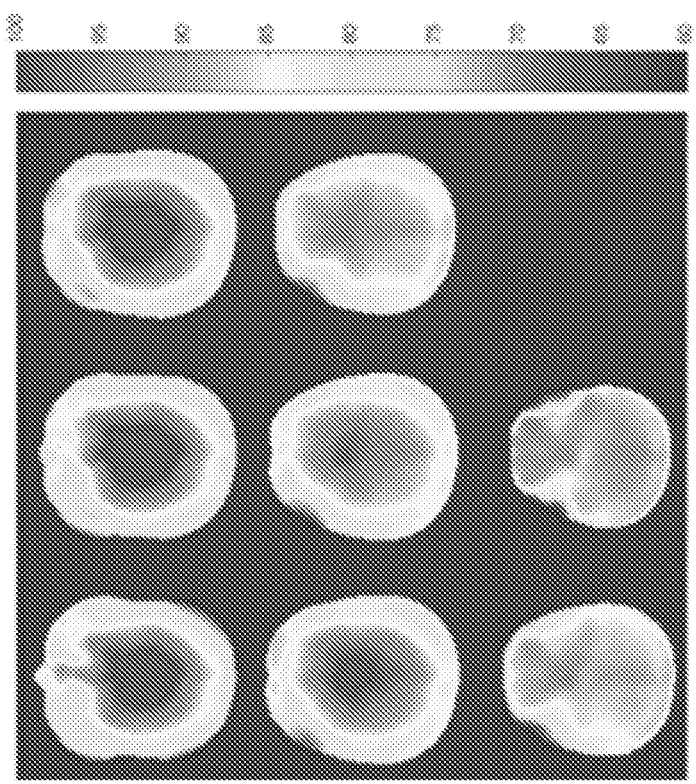
FIG. 5 is a B1 inhomogeneity map for a targeted flip angle of 90 degree, with the units of the colorbar in degree.

FIG. 5 shows the B1 inhomogeneity measured for a targeted 90 degree flip angle. The center of the brain had 15% higher B1 than what was designed and the edge of brain had about 15% lower. The average B1 of the whole brain region provided flip angle 86.7 degree, which approached the designed flip angle well.

Blurring Correction on Volunteers Images

Figure 6:
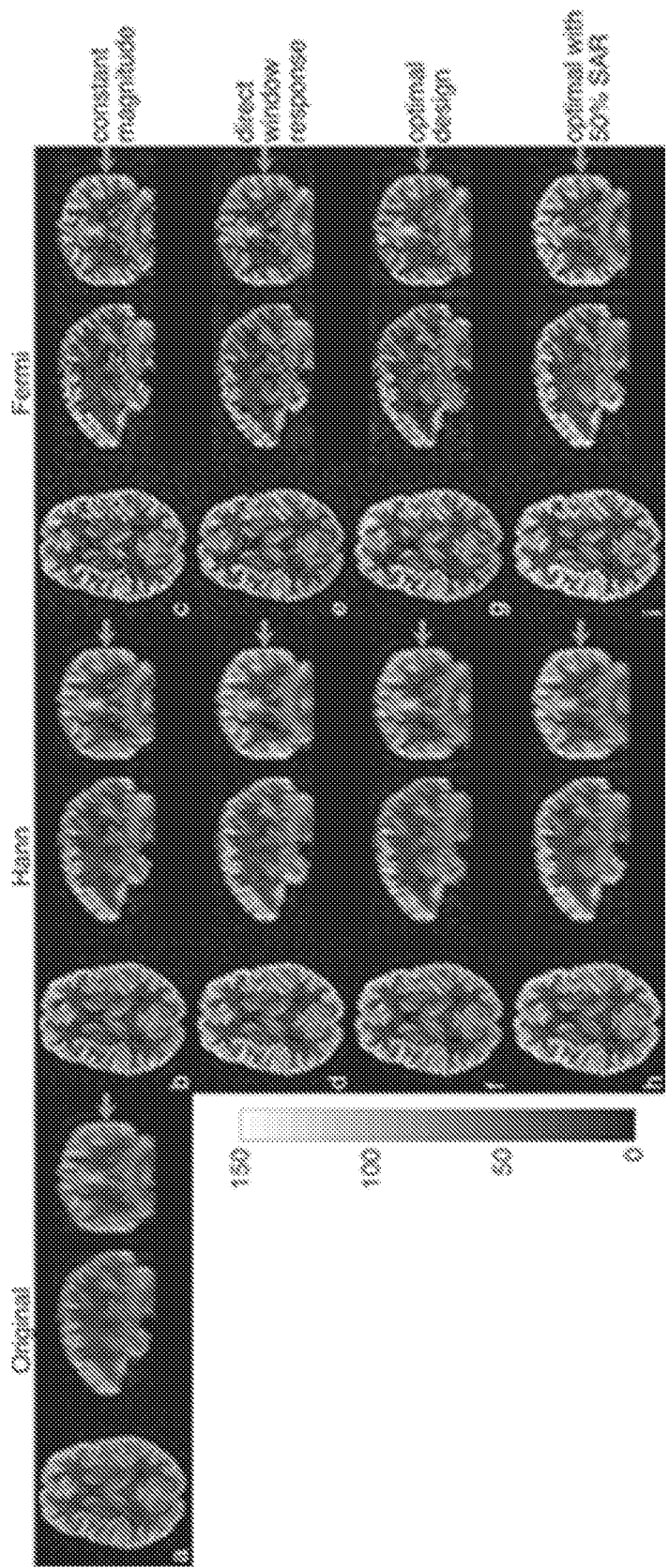
FIG. 6 is a collection of images showing reduced T2 blurring of CBF maps of one selected ASL case.
Figure 7:
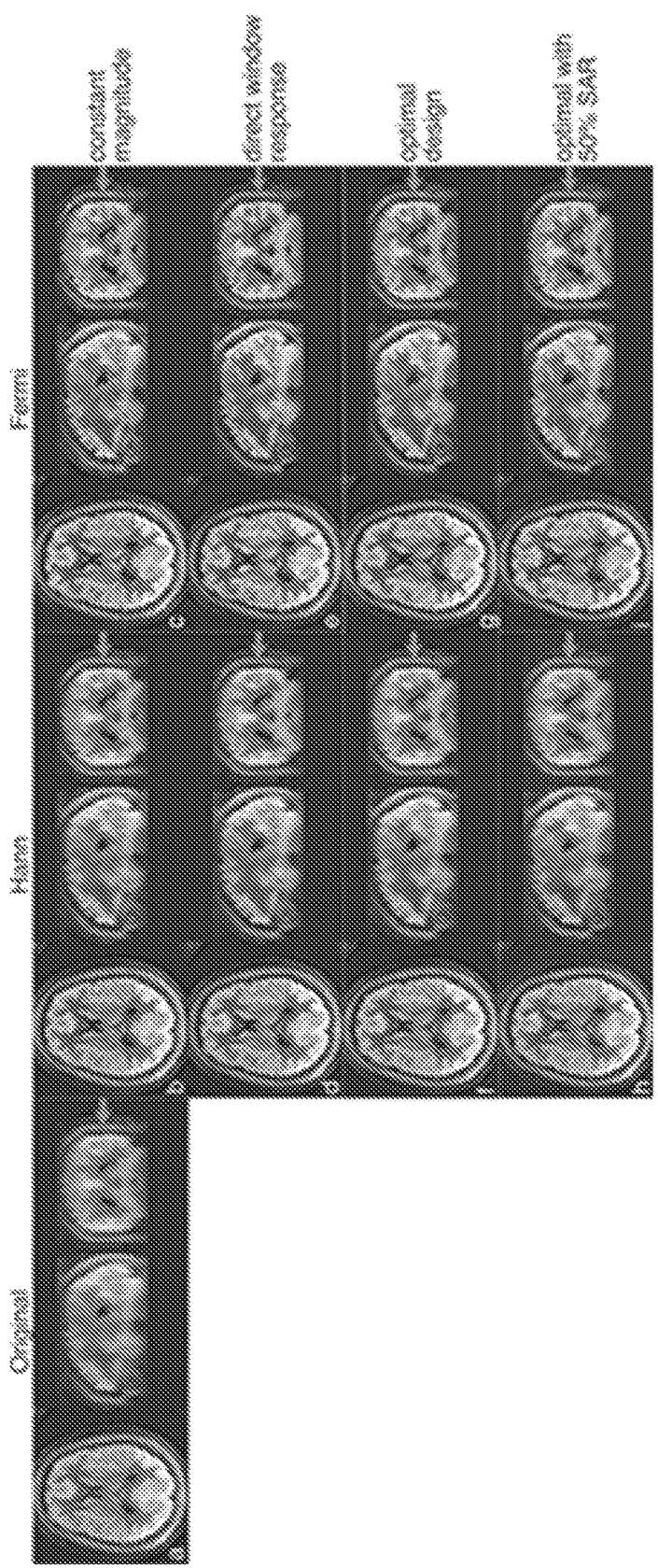
FIG. 7 is a collection of images showing reduced T2 blurring of T1 weighted imaged maps of one selected case.

FIG. 6 shows the proposed flip angle schemes and corresponding corrected CBF maps of one selected case. Comparing to the original constant amplitude flip angle, the images with Hann window correction provided sharper structure in though-slice direction. The reduction of image blurring was highlighted by the arrows. The contrast between grey and white matters was also improved, not only in the coronal and sagittal slice, but also in the axial plane. It could be the benefits of the reduced the partial volume effect. The images with Fermi window correction resulted in further improvement. It suffered more SNR penalty, however. The noise in the white matter can be an indicator of SNR level. Similar results can be found in the T1 weighted images shown in FIG. 7, although the SNR was much higher.

Figure 8A:
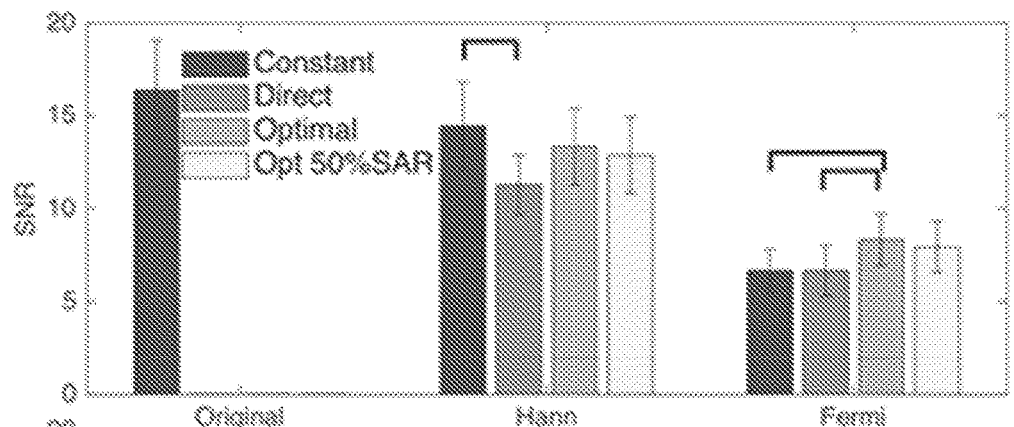
FIG. 8A is a graph showing SNR statistical performance of the method of the present disclosure across seven subjects, where the error bar stands for the standard deviation and the connectors stand for significant difference between the two method with $p<0.05$.
Figure 8B:
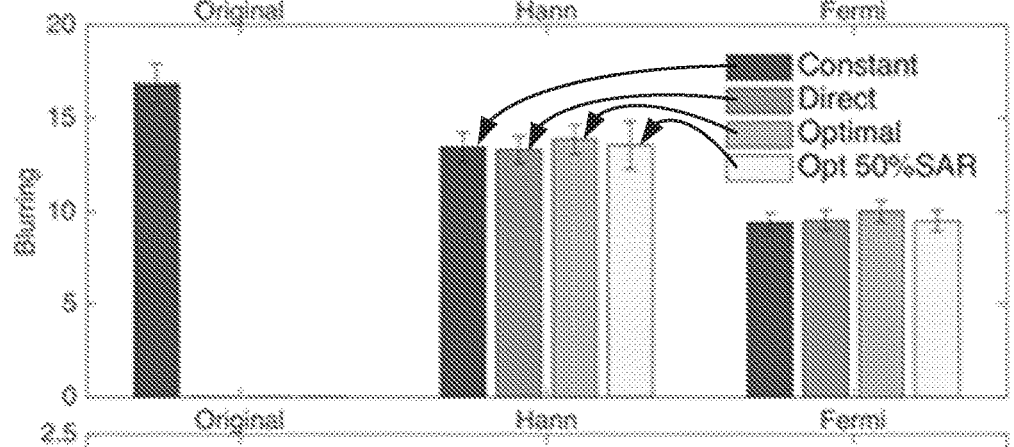
FIG. 8B is a graph showing blurring statistical performance of the method of the present disclosure across seven subjects, where the error bar stands for the standard deviation and the connectors stand for significant difference between the two method with $p<0.05$.
Figure 8C:
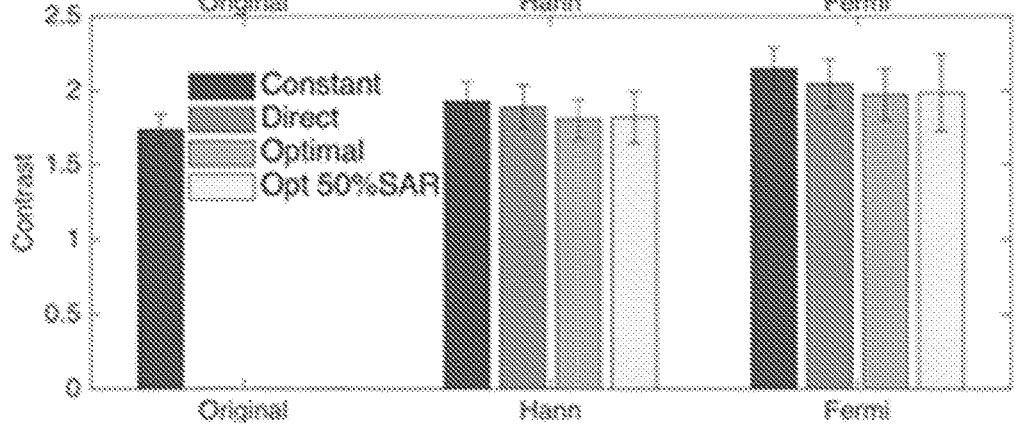
FIG. 8C is a graph showing contrast statistical performance of the method of the present disclosure across seven subjects, where the error bar stands for the standard deviation and the connectors stand for significant difference between the two method with $p<0.05$.

Results from a statistical analysis of the methods described herein are shown in FIGS. 8A-8C. Compared to original constant amplitude images without correction, the corrected image with all methods had reduced blurring and improved contrast, which were at the cost of SNR. In general, the Fermi window results reduced the blurring and improved the contrast further, compared to the corrections with Hann window. The optimal flip angle designs showed the significant higher SNR for both Fermi window correction ($p<0.05$), compared to the constant amplitude design and direct window response design. With the 50% SAR constraint, the proposed method maintained the performance well and there was no significant difference from the optimal method with flip angle constraint only.

In the analysis of image blurring, the Fermi window correction had less blurring results than the Hann window corrections and original constant amplitude method without correction. There is no significant difference between methods when they were corrected to the same window function.

The contrast between grey and white matter was also improved sequentially from Hann window to Fermi window correction. There is no significant difference between methods when they were corrected to the same window function.

The combination design of flip angle and echo scaling modulation can provide an optimal flip angle design in fast spin echo acquisition. The systems and methods provided herein can change the flip angle design process from an intuitively driven heuristic process to a well-proposed optimization problem. Although the proposed method was demonstrated on correction of T2 blurring with higher SNR and lower SAR results, it has the flexibility to optimize for a range of different criteria, phase orders, and echo train lengths.

Discussion

Thus, a systematic framework is provided for variable flip angle design and demonstrated its advantages in a combined design of the flip angle and k-space filtering for control of T2 blurring in 3D ASL. This method outperformed the conventional methods by providing superior SNR. The performance was well maintained even when the SAR was constrained to 50% of the constant amplitude flip angle design. Relative to the direct design with only variable flip angle, the optimal designs are characterized by higher flip angles in the first few echoes. This likely improves the efficiency of the transition to the pseudo-steady state. The flip angle trains also maintain higher flip angles at intermediate echo numbers. This appears to be more efficient than the rise of flip angle at the end of the echo train in the Direct design with only variable flip angle.

The framework of variable flip angle design proposed in this work has several additional advantages. First, the SAR can be designed simultaneously and precisely with the variable flip angles. As demonstrated in the 50% SAR limitation design, the proposed method can include an arbitrary level of SAR requirement as a constraint in the design and achieve it precisely. It provides a general approach for SAR optimization in RARE applications. Second, the proposed framework also allows for constraints on both the maximum and minimum flip angle in the design. Maximum flip angle constraints can be useful for RF amplitude limited systems. Minimum flip angle constraints can help to control the sensitivity to motion and flow of low flip angle RARE designs. Third, in addition to PSF and SNR optimization, the proposed framework is capable of designing variable flip angles for a general cost function, with the potential for added terms to reduce the sensitivity to RF transmit inhomogeneity or to achieve a certain effective TE.

Although our optimized 3D ASL acquisition with variable flip angles was demonstrated to improve resolution in perfusion and anatomic images, the low flip angles used may suppress the signal from flowing blood in arteries. Such low flip angle signal attenuation would blur arterial signal. This would be a problem, for example, if a substantial fraction of the ASL signal is in the arteries, as may occur at shorter postlabeling delays. Indeed, there is some indication of bright vascular signal in the Constant method images that is reduced in the other low-flip-angle images. Bright signal in arteries may be an artifact for some applications, but may also provide diagnostic information. Delayed signal in vessels in ischemic stroke may be an indicator of collateral flow, and bright signal can indicate shunted flow through arteriovenous malformations or dural arteriovenous fistulas; therefore, selection of different minimum flip angle constraints in the optimizations for different applications may be appropriate.

Depending on the details of the imaging sequence used for ASL, the number of echoes and time between echoes may differ from those we explored here. Generally, the total duration of the echo train is the primary driver of the flip angle modulation. Interpolation between optimized flip angles to create a larger number of echoes while preserving the duration of the echo train will produce a result very similar to a full optimization. We expect that echo trains that are very long compared with T2 will require lower flip angles and larger k-space filtering scaling factors for de-blurring. Because de-blurring has a larger effect on signal and noise for such long echo trains, they will benefit more from using an optimal correction. Our optimization strategy is general, however, and can be performed for any selected echo number and spacing.

The proposed method also has the potential for correcting T2 blurring and optimizing the acquisition in general RARE applications, such as abdominal imaging (EXAMPLE II below), pediatric MRI, and MR angiography.

Example II

As described, VFA can be designed to maximize or improve SNR, while controlling T2 blurring with a k-space filter correction and maintaining the contrast. Because spleen and liver metastases have similar T2 and proton densities, the above-described systems and methods can be extended to improve liver and spleen image quality in healthy subjects to enable better detection of liver metastases.

The signals of the liver and spleen can be given by $S_{liver}$ and $S_{spleen}$ during the echo train. The tissue contrast can be defined as:

$$\frac{S_{liver}(k) - S_{spleen}(k)}{S_{liver}(k) + S_{spleen}(k)} > c; \quad \text{Eqn. 20}$$

Where the kth echo is acquired at the k-space center, c is the desired contrast (as a non-limiting example in this study, c was 0.3).

The target of the optimal VFA design framework can be framed to maximize SNR or otherwise maintain SNR above a threshold when the signal of the liver is corrected to a k-space filter W, as a non-limiting example, a Hanning window in this study.

$$SNR \propto \frac{1}{\sigma} \frac{\sum W_i}{\sqrt{\sum \left(\frac{W_i}{S_{liver}}\right)^2}}; \text{ and} \quad \text{Eqn. 21}$$

$$\hat{S} = \operatorname{argmin} \sum \left(\frac{W_i}{S_{liver}}\right)^2. \quad \text{Eqn. 22}$$

Using the above-described context, a three flip angle scheme can be utilized, which can be referred to as optimal 1, 2, and 3, and which constrains the minimum flip angle to 0, 45 and 60 degrees, respectively. In non-limiting example, T1, T2, and relative proton density were set to 1328 ms, 61 ms, and 1 for the spleen, and to 809 ms, 34 ms and 0.7 for the liver.

Two conventional flip angle designs were also acquired as references: a constant amplitude flip angle design with flip angle 130 degrees, named 'Constant', and a previously published variable flip angle design (6), named 'VFA'.

Experiments were performed on a GE 3T scanner using a single-slice of the liver that was acquired within a breath-hold. Image size was 382×224 and echo spacing was 4.8 ms in VFA. Parallel imaging was used to reduce the echo train length by a factor of 2.5. Echo-train characteristics for each design are listed in Table 2.

|  | Constant | VFA | Optimal 1 | Optimal 2 | Optimal 3 |
| --- | --- | --- | --- | --- | --- |
| Echo train length | 70 | 75 | 80 | 72 | 72 |
| k-space center | 16 | 22 | 29 | 21 | 21 |
| Skipped echoes | 1 | 5 | 0 | 0 | 0 |

Images were reconstructed and processed in MATLAB 2017. Liver and spleen regions were selected manually on the 'constant'. Noise level was measured as the standard deviation of the background and SNR was calculated as the ratio between liver signal and background noise. Image blurring was quantified by a non-reference method (as described in Crete-Roffe F, Dolmiere T, Ladret P, Nicolas M. The Blur Effect: Perception and Estimation with a New No-Reference Perceptual Blur Metric. SPIE Electron. Imaging Symp. Conf Hum. Vis. Electron. Imaging 2007:EI 6492-6416), where low values represent sharp images. The contrast between spleen and liver was calculated as Eqn 20.

In this non-limiting example study, the contrast between spleen and liver was consistent between the design (>0.3) and the experiment (0.31, 0.30, and 0.33 for the optimal designs 1, 2, and 3). Compared to the 'constant' (blurring=0.2, SNR=25.7) and 'VFA' (blurring=0.21, SNR=26.9), the proposed methods reduced the blurring (blurring of optimal 1/2/3=0.16/0.17/0.16) with a slight SNR penalty (SNR of optimal 1/2/3=23.9/25.0/24.2). Reduced blurring on the edges of the liver was demonstrated.

This improvement is due to the more uniformly distributed echo signals across k-space in the methods provided herein, which reduced the high-frequency noise amplification in the k-space filter correction. The optimal 1 design also suppressed the signal of blood in large vessels and CSF in the spinal canal due to the use of low flip angles. However, it increased motion-sensitivity and B1 inhomogeneity, which could result in motion and dielectric artifacts. The flow suppression was reduced when higher flip angles were used in the optimal 2 and 3 designs.

This work demonstrated simultaneous contrast and resolution control with an optimal framework of variable flip angle design for fast spin echo. The methods provided superior spatial resolution with slightly reduced SNR, compared to conventional constant amplitude and existing variable flip angle designs. This framework can be extended to general echo train based acquisitions and offers flexible control of contrast, blurring and power deposition.

The present invention has been described in terms of one or more preferred embodiments, and it should be appreciated that many equivalents, alternatives, variations, and modifications, aside from those expressly stated, are possible and within the scope of the invention.

As used in the claims, the phrase "at least one of A, B, and C" means at least one of A, at least one of B, and/or at least one of C, or any one of A, B, or C or combination of A, B, or C. A, B, and C are elements of a list, and A, B, and C may be anything contained in the Specification.

The invention claimed is:

1. A method for acquiring magnetic resonance imaging (MRI) images of a subject, the method comprising:
designing a pulse sequence to elicit spin echoes, wherein the pulse sequence includes a radio frequency (RF) excitation pulse and a series of RF refocusing pulses that refocus echoes with flip angles in the series of RF refocusing pulses that are varied;
performing the pulse sequence to acquire MRI data from the subject;
scaling MM data associated with each echo by a correction factor that is determined for each echo to create scaled MRI data that is not the same for all echoes; and
reconstructing an image of the subject using the scaled MM data.

2. The method of claim 1 wherein the pulse sequence is further designed to spatially encode each echo with a different phase encoding gradient.

3. The method of claim 2 wherein the correction factor determined for each echo forms a filter.

4. The method of claim 1 further comprising a correction form comprising a multiplicative correction factor.

5. The method of claim 1 further comprising performing a magnetic resonance physics simulation to select flip angles for the series of RF refocusing pulses and each correction factor to optimize a combination of criteria.

6. The method of claim 5 wherein the combination of criteria includes at least two of image resolution for at least one tissue, point spread function for at least one tissue, signal to noise ratio in the image of the subject, contrast to noise ratio in the image of the subject, radiofrequency power deposited to the subject, or a minimum flip angle.

7. The method of claim 5 further comprising performing a numerical optimization to find one of a maximum or minimum value of a mathematical objective function designed to optimize the combination of criteria.

8. The method of claim 7 wherein the objective function is monotonically related to a signal-to-noise ratio (SNR) in a given voxel in the image of the subject by:

$$SNR^2 = \frac{\sum_i (f_i S_i)^2}{\sum_i (f_i n)^2} = \frac{\sum_i (w_i)^2}{\sum_i \left(\frac{w_i}{S_i} n\right)^2}$$

where n is a thermal noise at each echo, $w_i$ is the value of a target window function at echo i, $S_i$ is signal at echo i for a particular train of refocusing pulse amplitudes and assumed relaxation times, and $f_i$ is a multiplicative scale factor selected for echo i.

9. The method of claim 7 wherein the objective function is monotonically related to the voxel SNR plus a weighted factor reflecting a deviation of a corrected signal from a target window given by:

$$func = \frac{\sum_i (f_i S_i)^2}{\sum_i (f_i n)^2} - \lambda \sum_i (w_i - f_i S_i)^2$$

where $\lambda$ is a weighting function selected by a user, n is a thermal noise at each echo, $w_i$ is the value of a target window function at echo i, $S_i$ is signal at echo i for a particular train of refocusing pulse amplitudes and assumed relaxation times, and f is a multiplicative scale factor selected for echo i.

10. The method of claim 7 wherein the objective function is monotonically related to a voxel contrast-to-noise ratio (CNR) in the image of the subject given by:

$$CNR^2 = \frac{\sum_i (f_i (S_i^1 - S_i^2))^2}{\sum_i (f_i n)^2} = \frac{\sum_i (w_i)^2}{\sum_i \left(\frac{w_i}{S_i^1 - S_i^2} n\right)^2}$$

where n is a thermal noise at each echo, $w_i$ is the value of a target window function at echo i, $S_i$ is signal at echo i for each of two tissues for a particular train of refocusing pulse amplitudes, and $f_i$ is a multiplicative scale factor selected for echo i.

11. The method of claim 7 wherein the objective function is a combination form by mathematical combination of at least two of signal to SNR, CNR, and window deviation terms.

12. The method of claim 7 wherein the objective function constrains a maximum or minimum refocusing flip angle or a sum of squares of the flip angle that is proportional to deposited radiofrequency power.

13. The method of claim 7 wherein the objective function includes a weighted effect of power deposition.

14. The method of claim 7 wherein the objective function constrains the effective TE at an echo where a center of k-space is encoded to be a targeted value.

15. The method of claim 7 wherein an ordering of k-space encoding is adjusted such that a center of k-space is encoded at an echo where an effective TE is a targeted value.

16. The method of claim 1 wherein the correction factor is selected to correct the MRI data to achieve a desired overall filtering function or windowing function applied to the image of the subject for a set of tissue relaxation times.

17. The method of claim 16 wherein a given correction factor is given by:

$$f_i = \frac{w_i}{S_i}$$

where $w_i$ is a value of the a window function at echo i, $S_i$ is the signal at echo i for a particular train of refocusing pulse amplitudes and assumed relaxation times, and $f_i$ is the scale factor for echo i.

18. The method of claim 1 wherein the correction factor is selected to correct a difference between echo signals from two different tissues in the subject with different relaxation times and proton density to achieve a desired overall filtering or windowing function applied to a contrast in the image of the subject.

19. The method of claim 18 wherein correction factor is selected based on:

$$f_i = \frac{w_i}{S_i^1 - S_i^2}$$

where $w_i$ is a value of the windowing function at echo i, $S_i$ is the signals at echo i for each of the two different tissues for a particular train of refocusing pulse amplitudes, and $f_i$ is the correction factor for echo i.

20. A system comprising:
a magnet system configured to generate a polarizing magnetic field about at least a portion of a subject;
a magnetic gradient system including a plurality of magnetic gradient coils configured to apply at least one magnetic gradient field to the polarizing magnetic field;
a radio frequency (RF) system configured to apply an RF field to the subject and to receive magnetic resonance signals from the subject using a coil array;
a computer system programmed to:
control the magnetic gradient system and the RF system to perform a pulse sequence to elicit spin echoes and acquire MM data from the spin echoes, wherein the pulse sequence includes a radio frequency (RF) excitation pulse and a series of RF refocusing pulses that refocus echoes where flip angles of the RF refocusing pulses are not all the same;
scale MRI data associated with each echo by a correction factor that is determined for each echo to create scaled MRI data and that is varied across echoes; and
reconstruct an image of the subject using the scaled MM data.

21. The system of claim 20 wherein the computer is further configured to perform a magnetic resonance physics simulation to select flip angles for the series of RF refocusing pulses and each correction factor to optimize a combination of criteria.

22. The system of claim 21 wherein the combination of criteria includes at least two of image resolution for at least one tissue, point spread function for at least one tissue, signal to noise ratio in the image of the subject, contrast to noise ratio in the image of the subject, radiofrequency power deposited to the subject, or a minimum flip angle.

* * * * *

UNITED STATES PATENT AND TRADEMARK OFFICE
CERTIFICATE OF CORRECTION

PATENT NO. : 11,163,028 B2
APPLICATION NO. : 16/498672
DATED : November 2, 2021
INVENTOR(S) : David C. Alsop et al.

It is certified that error appears in the above-identified patent and that said Letters Patent is hereby corrected as shown below:

In the Specification

Column 13, Line 37, "and a is" should be --and $\sigma$--.

In the Claims

Column 21, Claim 1, Line 42, "MM" should be --MRI--.

Column 21, Claim 1, Line 46, "MM" should be --MRI--.

Column 22, Claim 9, Line 32, "f" should be --$f_i$--.

Column 24, Claim 20, Line 10, "MM" should be --MRI--.

Column 24, Claim 20, Line 20, "MM" should be --MRI--.

Signed and Sealed this
Fourth Day of January, 2022

Drew Hirshfeld
*Performing the Functions and Duties of the*
*Under Secretary of Commerce for Intellectual Property and*
*Director of the United States Patent and Trademark Office*